(12) United States Patent
Saito et al.

(10) Patent No.: US 11,764,040 B2
(45) Date of Patent: Sep. 19, 2023

(54) PLACING TABLE AND SUBSTRATE PROCESSING APPARATUS

(71) Applicant: Tokyo Electron Limited, Tokyo (JP)

(72) Inventors: Michishige Saito, Miyagi (JP); Shota Kaneko, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 417 days.

(21) Appl. No.: 16/778,071

(22) Filed: Jan. 31, 2020

(65) Prior Publication Data
US 2020/0251315 A1 Aug. 6, 2020

(30) Foreign Application Priority Data
Feb. 1, 2019 (JP) ................. 2019-017387

(51) Int. Cl.
*H01J 37/32* (2006.01)
*F28F 1/40* (2006.01)
*H01L 21/683* (2006.01)

(52) U.S. Cl.
CPC .......... *H01J 37/32724* (2013.01); *F28F 1/40* (2013.01); *H01L 21/6833* (2013.01)

(58) Field of Classification Search
CPC ........ H01J 2237/2001; H01J 37/32724; H01L 21/67109; F28F 1/40
See application file for complete search history.

(56) References Cited

U.S. PATENT DOCUMENTS

| | | | | |
|---|---|---|---|---|
| 5,250,137 A | * | 10/1993 | Arami ............... | H01L 21/67069 156/345.46 |
| 5,342,471 A | * | 8/1994 | Fukasawa ......... | H01J 37/32522 156/914 |
| 5,427,670 A | * | 6/1995 | Baggerman ....... | H01L 21/67069 204/298.15 |
| 6,432,208 B1 | * | 8/2002 | Kawakami ........ | H01L 21/67103 118/724 |
| 7,230,204 B2 | * | 6/2007 | Mitrovic ........... | H01L 21/67248 219/486 |
| 2004/0065259 A1 | * | 4/2004 | Inazumachi ...... | H01L 21/67109 118/724 |
| 2004/0097088 A1 | * | 5/2004 | Kitayama ......... | H01L 21/67109 156/345.1 |
| 2004/0113287 A1 | * | 6/2004 | Kishimoto ............... | C23C 16/24 438/166 |
| 2006/0005930 A1 | * | 1/2006 | Ikeda ................. | H01J 37/32431 156/345.51 |
| 2009/0000743 A1 | * | 1/2009 | Iizuka ............... | H01J 37/32449 156/345.34 |
| 2009/0250202 A1 | * | 10/2009 | Eibl .................. | H01L 21/67109 165/200 |

(Continued)

FOREIGN PATENT DOCUMENTS

CN 108987323 * 12/2018 ....... H01L 21/67109
JP 2003-338492 A 11/2003
(Continued)

*Primary Examiner* — Tho V Duong
(74) *Attorney, Agent, or Firm* — Pearne & Gordon LLP (57) ABSTRACT

A placing table, on which a substrate is placed, includes a base. The base includes a first path configured to allow a heat transfer medium having a first temperature to flow therein; a first heat insulating layer disposed under the first path; and a seal member disposed under the first heat insulating layer.

11 Claims, 3 Drawing Sheets

(56) References Cited

U.S. PATENT DOCUMENTS

| | | | | |
|---|---|---|---|---|
| 2010/0084579 | A1* | 4/2010 | Fish | H01L 21/67109 |
| | | | | 250/492.21 |
| 2010/0326957 | A1* | 12/2010 | Maeda | H01J 37/20 |
| | | | | 156/345.26 |
| 2018/0330925 | A1* | 11/2018 | Sim | H01J 37/3244 |
| 2020/0095671 | A1* | 3/2020 | Chang | C23C 16/4586 |

FOREIGN PATENT DOCUMENTS

| | | | | |
|---|---|---|---|---|
| JP | 2014-112672 A | 6/2014 | | |
| JP | 2015-222802 A | 12/2015 | | |
| JP | 2016-082077 A | 5/2016 | | |
| JP | 2018-107433 A | 7/2018 | | |
| JP | 2018-125463 A | 8/2018 | | |
| JP | 2018-525808 A | 9/2018 | | |
| KR | 20100098509 | * | 9/2010 | ........ H01J 37/32724 |
| WO | 2017/024132 A1 | 2/2017 | | |

* cited by examiner

FIG. 3

PLACING TABLE AND SUBSTRATE PROCESSING APPARATUS

CROSS-REFERENCE TO RELATED APPLICATION

This application claims the benefit of Japanese Patent Application No. 2019-017387 filed on Feb. 1, 2019, the entire disclosure of which is incorporated herein by reference.

TECHNICAL FIELD

The various aspects and embodiments described herein pertain generally to a placing table and a substrate processing apparatus.

BACKGROUND

A substrate processing apparatus has, in a processing vessel, a placing table configured to place a substrate thereon. An O-ring is provided at a bottom surface of the placing table to be located between the placing table and a member disposed under the placing table. The O-ring is configured to seal a vacuum space within the processing vessel from an atmospheric space under the placing table, thus maintaining a vacuum state within the processing vessel.

By way of example, Patent Document 1 describes providing an electrostatic chuck configured to attract a substrate electrostatically at a placing table within a processing vessel and providing an O-ring at a bottom surface of the electrostatic chuck to be located between the electrostatic chuck and a member disposed under the electrostatic chuck.

Patent Document 1: Japanese Patent Laid-open Publication No. 2018-107433

SUMMARY

In one exemplary embodiment, a placing table, on which a substrate is placed, includes a base. The base comprises a first path configured to allow a heat transfer medium having a first temperature to flow therein; a first heat insulating layer disposed under the first path; and a seal member disposed under the first heat insulating layer.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. In the various drawings, same parts will be assigned same reference numerals, and redundant description will be omitted.

Substrate Processing Apparatus

Figure 1:
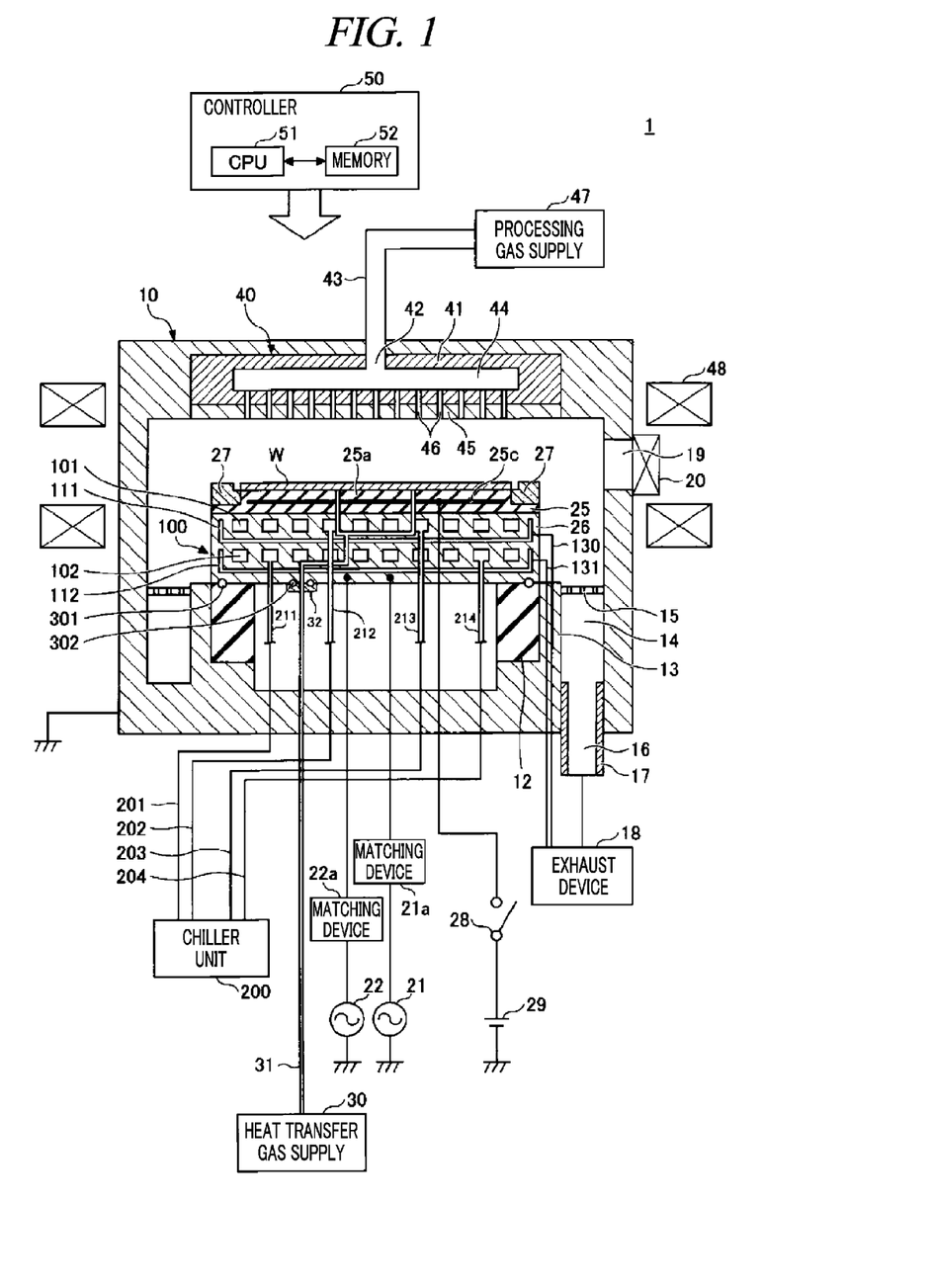
FIG. 1 is a schematic cross sectional view illustrating an example of a substrate processing apparatus according to an exemplary embodiment.

FIG. 1 is a cross sectional view illustrating a schematic configuration of a substrate processing apparatus 1 according to an exemplary embodiment. The substrate processing apparatus 1 is an RIE (reactive ion etching) type substrate processing apparatus. The substrate processing apparatus 1 may be applicable to a plasma etching apparatus, a plasma CVD apparatus, or the like.

The substrate processing apparatus 1 has a cylindrical processing vessel 10 made of a metal such as, but not limited to, aluminum or stainless steel. An inside of the processing vessel 10 is configured as a processing space in which a plasma processing such as plasma etching or plasma CVD is performed. The processing vessel 10 is grounded.

A circular plate-shaped placing table 100 configured to place a wafer W thereon is provided within the processing vessel 10. The placing table 100 has an electrostatic chuck 25 and a base 26. The electrostatic chuck 25 is disposed on the base 26. The base 26 is made of, by way of non-limiting example, an aluminum or titanium alloy, and supported by a cylindrical support 13 which extends vertically upwards from a bottom of the processing vessel 10 with an insulating cylindrical supporting member 12 therebetween.

A central portion of the electrostatic chuck 25 is composed of a dielectric film 25a and an attraction electrode 25c which is made of a conductive film and embedded in the dielectric film 25a. The attraction electrode 25c is electrically connected with a DC power supply 29 via a switch 28. The wafer W is held by the electrostatic chuck 25 with an electrostatic attraction force generated by a voltage applied to the attraction electrode 25c from the DC power supply 29.

The electrostatic chuck 25 has the circular plate-shaped central portion on which the wafer W is placed and an annular peripheral portion. A height of the central portion is higher than a height of the peripheral portion. An edge ring 27 is disposed on a top surface of the peripheral portion to surround an edge of the substrate in a ring shape. This edge ring 27 is also called a focus ring.

An exhaust path 14 is formed between a sidewall of the processing vessel 10 and the cylindrical support 13. An annular baffle plate 15 is provided at an inlet of the exhaust path 14 or at a portion of the exhaust path 14. An exhaust opening 16 is provided at a bottom portion of the exhaust path 14. The exhaust opening 16 is connected with an exhaust device 18 via an exhaust line 17. The exhaust device 18 has a vacuum pump and is configured to decompress the processing space within the processing vessel 10 to a required vacuum level. Further, the exhaust line 17 is provided with an automatic pressure control valve (not shown) which is a variable butterfly valve, and a control over an internal pressure of the processing vessel 10 is performed by the automatic pressure control valve. A gate valve 20 configured to open or close a carry-in/out opening 19 for the wafer W is provided at the sidewall of the processing vessel 10.

The substrate processing apparatus 1 is equipped with a first high frequency power supply 21 and a second high frequency power supply 22. The first high frequency power supply 21 is a power supply configured to generate a first high frequency power. The first high frequency power has a frequency suitable for plasma formation. The frequency of the first high frequency power is in the range from, e.g., 27 MHz to 100 MHz. The first high frequency power supply 21 is connected to the placing table 100 via a matching device 21a. The matching device 21a has a circuit configured to match an output impedance of the first high frequency power supply 21 and an impedance at a load side (placing table 100 side).

The second high frequency power supply 22 is a power supply configured to generate a second high frequency power. The second high frequency power has a frequency lower than the frequency of the first high frequency power. When the second high frequency power and the first high frequency power are supplied together, the second high frequency power is used as a high frequency bias power for ion attraction into the wafer W. The frequency of the second high frequency power is in the range from, e.g., 400 kHz to 13.56 MHz. The second high frequency power supply 22 is connected to the placing table 100 via a matching device 22a. The matching device 22a has a circuit configured to match an output impedance of the second high frequency power supply 22 and an impedance at the load side (placing table 100 side).

Further, plasma may be formed by supplying only the second high frequency power without supplying the first high frequency power, that is, by supplying a single high frequency power. In such a case, the frequency of the second high frequency power may be larger than 13.56 MHz, for example, 40 MHz. The substrate processing apparatus 1 may not be equipped with the first high frequency power supply 21 and the matching device 21a. In such a case, the second high frequency power supply 22 constitutes an example of a plasma generator.

A shower head 40 is disposed at a ceiling portion of the processing vessel 10, facing the placing table 100. The high frequency power from the first high frequency power supply 21 is applied between the placing table 100 and the shower head 40.

With this configuration, the placing table 100 serves as a lower electrode, and the shower head 40 serves as an upper electrode having a ground potential. Further, the first high frequency power supply 21 may be connected to the shower head 40 via the matching device 21a.

A first path 101 and a second path 102 are respectively provided in an upper portion and a lower portion of the base 26. A heat transfer medium having a first temperature is flown into the first path 101 from a chiller unit 200 to be circulated therein via pipelines 202, 212, 213 and 203. A heat transfer medium having a second temperature is flown into the second path 102 from the chiller unit 200 to be circulated therein via pipelines 201, 211, 214 and 204. The second temperature of the heat transfer medium flown into the second path 102 is higher than the first temperature of the heat transfer medium flown into the first path 101.

The first path 101 extends in a spiral shape or concentric shape along a circumferential direction of a wafer placing surface. The first path 101 is configured to correspond to the entire region of the wafer placing surface of the electrostatic chuck 25, and an outermost portion of the first path 101 is formed at an outside of an edge of the wafer W. Accordingly, controllability over a temperature of the wafer W can be improved, so that in-surface uniformity of a temperature distribution of the wafer W can be achieved.

A first heat insulating layer 111 is disposed under the first path 101. The second path 102 is disposed under the first heat insulating layer 111. A second heat insulating layer 112 is disposed under the second path 102. The second path 102 extends in a spiral shape or concentric shape along the circumferential direction of the wafer placing surface. The second path 102 may have the same shape as the first path 101 or may have a different shape. The second path 102 is configured to correspond to the entire region of the wafer placing surface of the electrostatic chuck 25, and an outermost portion of the second path 102 is formed at an outside of the edge of the wafer W. Accordingly, controllability over a temperature of a portion of the base 26 under the first heat insulating layer 111 can be improved.

A heat transfer gas supply 30 is configured to supply a heat transfer gas into a gap between a rear surface of the wafer W and the electrostatic chuck 25 via a gas supply line 31. A gas having thermal conductivity, for example, a He gas may be appropriately supplied as the heat transfer gas.

An O-ring 301 is disposed between a bottom surface of the base 26 and a top surface of the cylindrical supporting member 12. An O-ring 32 is disposed between the bottom surface of the base 26 and a joint portion 32 of the gas supply line 31.

The shower head 40 at the ceiling portion has an electrode plate 45 at a bottom surface thereof and an electrode supporting body 41 configured to support the electrode plate 45 in a detachable manner. The electrode plate 45 has a multiple number of gas discharge holes 46. A buffer room 44 is provided within the electrode supporting body 41, and a gas inlet 42 connected with the buffer room 44 is connected to a gas supply line 43, and the gas supply line 43 is connected with a processing gas supply 47.

The individual components of the substrate processing apparatus 1 is connected with a controller 50. The controller 50 controls the individual components of the substrate processing apparatus 1. These individual components include, by way of example, the exhaust device 18, the first high frequency power supply 21, the second high frequency power supply 22, the switch 28, the DC power supply 29, the heat transfer gas supply 30, the processing gas supply 47, the chiller unit 200, and so forth.

The controller 50 is equipped with a CPU 51 and a memory 52 (storage device). The controller 50 reads out a program and a processing recipe stored in the memory 52 and executes them, thus controlling a required substrate processing in the substrate processing apparatus 1. Further, the controller 50 also performs a temperature control of the heat transfer medium supplied from the chiller unit 200, a control of the exhaust device 18, and so forth.

A magnet 48 extending in an annular shape or a concentric shape is disposed around the processing vessel 10, and a horizontal magnetic field oriented toward one direction is formed within the processing vessel 10 of the substrate processing apparatus 1 by the magnet 48. Further, a RF electric field in a vertical direction is formed by the high frequency power applied between the placing table 100 and the shower head 40. Accordingly, a magnetron discharge through the processing gas takes place within the processing vessel 10, so that plasma having a high density is formed from the processing gas near a front surface of the placing table 100.

In the substrate processing apparatus 1, to perform a substrate processing, the gate valve 20 is first opened, and a wafer W as a processing target is carried into the processing vessel 10 and placed on the electrostatic chuck 25. The heat transfer mediums having the first temperature and the second temperature supplied from the chiller unit 200 are respectively supplied into the first path 101 and the second path 102. Then, the processing gas is introduced into the processing vessel 10 from the processing gas supply 47 at a preset flow rate and a preset flow rate ratio, and an internal pressure of the processing vessel 10 is set to a predetermined value by the exhaust device 18 and the like. Further, the high frequency powers are supplied to the placing table 100 from the first high frequency power supply 21 and the second high frequency power supply 22, and the voltage from the DC power supply 29 is applied to the attraction electrode 25c to thereby attract the wafer W on the electrostatic chuck 25. Further, the heat transfer gas is supplied to the rear surface of the wafer W. Then, the processing gas discharged from the shower head 40 is formed into plasma, and a preset plasma processing is performed on a front surface of the wafer W by radicals or ions in the plasma.

Placing Table

Figure 2:
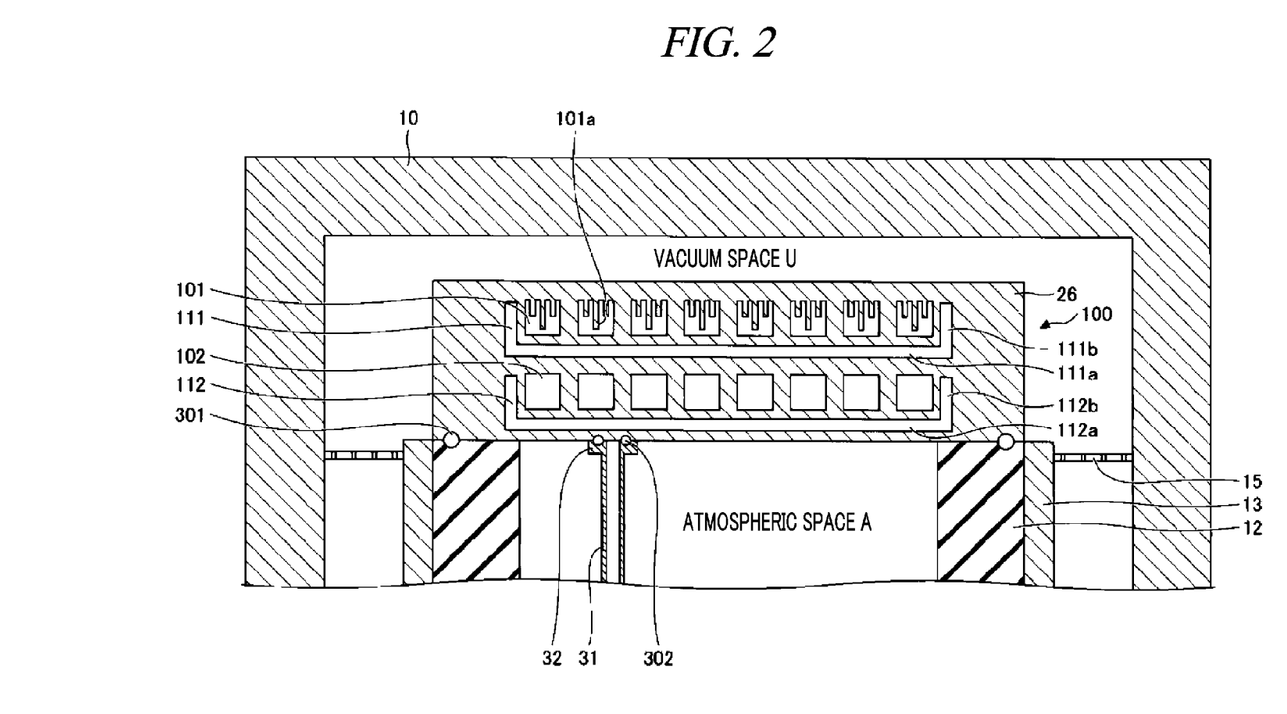
FIG. 2 is a schematic enlarged cross sectional view illustrating a placing table according to the exemplary embodiment.

Now, a detailed configuration of the placing table 100 according to the exemplary embodiment will be described with reference to FIG. 2. FIG. 2 is a schematic enlarged cross sectional view mainly illustrating the base 26 of the placing table 100 of FIG. 1. In this drawing, among the components of the placing table 100, the inside of the base 26 and the O-rings 301 and 302 placed at the bottom surface of the base 26 are mainly illustrated, and illustration of the electrostatic chuck 25, the edge ring 27 and the wafer W is omitted. Further, the placing table 100 may not be equipped with the electrostatic chuck 25. If the placing table 100 does not have the electrostatic chuck 25, a top portion of the base 26 is used as a placing surface for the wafer W.

The base 26 has the first path 101 through which the heat transfer medium having the first temperature is flown; and the first heat insulating layer 111 provided under the first path 101. Further, the base 26 has the second path 102 which is provided under the first heat insulating layer 111 and through which the heat transfer medium having the second temperature is flown; and the second heat insulating layer 112 provided under the second path 102. At the bottom surface of the base 26 under the second heat insulating layer 112, the O-rings 301 and 302 are disposed between the bottom surface of the base 26 and the members in contact with the bottom surface of the base 26 (the cylindrical supporting member 12 and the joint portion 32 of the gas supply line 31).

The heat transfer medium having the first temperature is circulated through the first path 101 to thereby cool the wafer W. The heat transfer medium flown into the first path 101 may be a liquid such as Fluorinert, liquid nitrogen, or a preset gas. The first temperature is controlled to be equal to or lower than −100° C. (hereinafter, referred to as "extremely low temperature"). Accordingly, the wafer placing surface of the placing table 100 is locally cooled to a temperature in an extremely low temperature range.

To increase a heat exchange rate, it is desirable that the first path 101 is provided with a fin structure having a large surface area in contact with the heat transfer medium. In the example of FIG. 2, a fin structure 101a having multiple columns is provided in the first path 101. The multiple columns of the fin structure 101a extend downwards from an upper portion of the first path 101, having different heights. With this configuration, the heat exchange rate can be increased, so that the wafer W placed above the first path 101 can be cooled to the extremely low temperature.

The structure provided in the first path 101 may be, instead of the fin structure, a lattice structure or an irregularity structure having recesses and/or protrusions. Here, however, if a mechanical strength of the first path 101 can be obtained, the first path 101 may not have the fin structure or the lattice structure.

The first heat insulating layer 111 has, at a lower portion and a side portion of the first path 101, first hollow spaces 111a and 111b which are formed to surround the first path 101. As illustrated in FIG. 1, the first hollow spaces 111a and 111b are connected to the exhaust device 18 by a metal pipeline 130, and evacuated by the exhaust device 18 to be controlled to be in a vacuum state. Accordingly, heat of the heat transfer medium flowing in the first path 101 is insulated by a heat insulation effect of the vacuum ("vacuum insulation effect") and is not transferred to below the first heat insulating layer 111.

However, without being limited thereto, the first hollow spaces 111a and 111b may be controlled to have a pressure lower than an atmospheric pressure. With this configuration as well, the vacuum insulation effect can be obtained. If a preset vacuum insulation effect can be achieved, the first heat insulating layer 111 may have only the first hollow space 111a at the lower portion of the first path 101 without having the first hollow space 111b at the side portion of the first path 101.

With the above-described configurations, a region within the base 26 where the first path 101 is provided is isolated and insulated by the first heat insulating layer 111 from a region under the first heat insulating layer 111. Accordingly, the wafer W can be cooled to the extremely low temperature, and, due to the vacuum insulation effect by the first heat insulating layer 111, the region under the first heat insulating layer 111 can be suppressed from being cooled to the extremely low temperature.

Further, though not shown in FIG. 2, the first hollow spaces 111a and 111b of the first heat insulating layer 111 may have a fin structure or a lattice structure to enhance the mechanical strength thereof. Here, however, it is important to configure the first hollow spaces 111a and 111b to be as large as possible to increase the vacuum insulation effect by reducing thermal conduction. Thus, in consideration of both the mechanical strength and the enlargement of the internal space of the first heat insulating layer 111, the fin structure or the lattice structure of the first heat insulating layer 111 may not be provided if enough mechanical strength is obtained even when the first heat insulating layer 111 does not have the fin structure or the lattice structure.

The second path 102 is provided at an opposite side from the first path 101 with the first heat insulating layer 111 therebetween. The heat transfer medium having the second temperature equal to or larger than, e.g., 0° C. is circulated in the second path 102. Accordingly, a region opposite from the first path 101 with the first heat insulating layer 111 therebetween can be suppressed from being cooled to the extremely low temperature through the cooling by the heat transfer medium of, e.g., −100° C. flowing in the first path 101.

The heat transfer medium flown into the second path 102 may be a liquid such as Fluorinert or a preset gas. The kind of the heat transfer medium flown into the second path 102 may be the same as or different from the kind of the heat transfer medium flown into the first path 101.

To increase a heat exchange rate, the second path 102 may be provided with a fin structure having a large surface area in contact with the heat transfer medium. For example, a fin structure having multiple columns may be provided in the second path 102, the same as in the first path 101. With this configuration, the heat exchange rate can be increased, and heat of the base 26 can be absorbed by the second path 102 in which the heat transfer medium having the second temperature close to the room temperature flows. Accordingly, a temperature of a region of the base 26 where the second path 102 is provided can be increased. Therefore, a temperature decrease of the entire base 26 that might be caused by circulating the heat transfer medium of the extremely low temperature in the first path 101 can be suppressed efficiently.

The structure provided in the second path 102 may be, instead of the fin structure, a lattice structure or an irregularity structure having recesses and/or protrusions. Here, however, if a mechanical strength of the second path 102 can be obtained, the second path 102 may not have the fin structure or the lattice structure.

The second heat insulating layer 112 has, at a lower portion and a side portion of the second path 102, second hollow spaces 112a and 112b which are formed to surround the second path 102. As illustrated in FIG. 1, the second hollow spaces 112a and 112b are connected to the exhaust device 18 by a metal pipeline 131, and evacuated by the exhaust device 18 to be controlled to be in a vacuum state. Accordingly, the heat of the heat transfer medium flowing in the first path 101 is further insulated by the vacuum insulation effect and is not transferred to below the second heat insulating layer 112.

However, without being limited thereto, the second hollow spaces 112a and 112b may be controlled to have a pressure lower than the atmospheric pressure. With this configuration as well, the vacuum insulation effect can be obtained. If a preset vacuum insulation effect can be achieved, the second heat insulating layer 112 may have only the second hollow space 112a at the lower portion of the second path 102 without having the second hollow space 112b at the side portion of the second path 102.

With this configuration, the heat of the base 26 is absorbed by supplying the heat transfer medium having the temperature close to the room temperature into the second path 102, and the region within the base 26 where the first path 101 is provided is further isolated and insulated by the second heat insulating layer 112 from a region under the second heat insulating layer 112. Accordingly, even in an environment where the wafer W is cooled to the extremely low temperature, a temperature of the region under the second heat insulating layer 112 is set to be higher than a glass transition point, so that deterioration of sealing effect of the O-rings 301 and 302 can be suppressed.

To elaborate, the O-rings 301 and 302 are made of fluorine rubber, silicon rubber, or the like. If the O-rings 301 and 302 are used at the extremely low temperature, the sealing effect thereof is deteriorated. In general, fluidity of a matter is reduced as the matter is cooled, and the matter changes from a liquid to a solid at a certain temperature (freezing point). A state in which the matter is stabilized as a solid is divided into a rubber state having rubber elasticity and a glass state in which the matter is completely frozen at a lower temperature. Even in case that an O-ring is formed of the silicon rubber having the glass transition point of about −60° C., if the O-ring is used at a temperature equal to or lower than −60° C., the O-ring turns into the glass state, so that the sealing effect thereof is deteriorated. As a result, a vacuum space U cannot be sealed from an atmospheric space A, resulting in a vacuum leak. Thus, it is difficult to use the O-ring at a temperature equal to or lower than the glass transition point while maintaining a state in which the sealing effect of the O-ring is achieved.

Recently, as a device structure is miniaturized and highly integrated, a contact hole or the like tends to have a high aspect ratio. It is considered to lower a temperature of the wafer W to the extremely low temperature to perform high-aspect etching. In such a case, however, a countermeasure to the deterioration of the sealing effect of the O-ring is required.

In contrast, in the placing table 100 having the above-described configuration, a cooling effect of the wafer W can be increased by circulating, in the first path 101, the heat transfer medium having the first temperature which is the extremely low temperature equal to or lower than −100° C. Meanwhile, even if the first temperature is lower than the glass transition point of the O-rings 301 and 302, the placing table 100 is capable of achieving the vacuum insulation by the first heat insulating layer 111 provided under the first path 101 and the second heat insulating layer 112 provided under the second path 102. Further, by allowing the heat transfer medium having the second temperature of, for example, the room temperature higher than the glass transition point to flow in the second path 102 provided under the first heat insulating layer 111, the placing table 100 is capable of absorbing the heat of the base 26.

Accordingly, by suppressing a temperature decrease of seal surfaces of the O-rings 301 and 302, temperatures of the seal surfaces can be set to be higher than the glass transition point. Thus, even in the configuration where the wafer W is cooled to the extremely low temperature, the vacuum space U within the processing vessel 10 can be sealed from the atmospheric space A under the base 26 by using the O-rings 301 and 302 without suffering the deterioration of the sealing effect of the O-rings 301 and 302. As a result, the airtightness of the vacuum space U can be maintained.

Further, the hollow spaces of the first heat insulating layer 111 and the second heat insulating layer 112 absorb a load from the bottom surface side of the base 26 caused by the atmospheric pressure due to a pressure difference between the vacuum space U and the atmospheric space A. Thus, bending deformation of the wafer placing surface can be suppressed.

Besides the O-rings 301 and 302, another O-ring may be disposed at a joint portion between the bottom surface of the base 26 and a pipeline through which a pusher pin is inserted, and still another O-ring may be disposed between the bottom surface of the base 26 and a member disposed under the base 26. In such a case, the airtightness of the vacuum space U can be maintained by the O-rings without suffering the deterioration of the sealing effect of the O-rings.

Furthermore, though not shown in FIG. 2, the second hollow spaces 112a and 112b of the second heat insulating layer 112 may have a fin structure or a lattice structure to enhance the mechanical strength thereof. Here, however, it is important to configure the second hollow spaces 112a and 112b to be as large as possible to increase the vacuum insulation effect by reducing thermal conduction. Thus, in consideration of both the enhancement of the mechanical strength and the enlargement of the internal space of the second heat insulating layer 112, the fin structure or the lattice structure of the second heat insulating layer 112 may not be provided if enough mechanical strength is obtained even when the second heat insulating layer 112 does not have the fin structure or the lattice structure.

Further, shapes of the second hollow spaces 112a and 112b may be the same as or different from the shapes of the first hollow spaces 111a and 111b. Furthermore, the second hollow spaces 112a and 112b may be connected with the first hollow spaces 111a and 111b to be configured as a single space, or may be separate from the first hollow spaces 111a and 111b.

Here, however, to improve the heat insulation effect, it is desirable that both the first hollow spaces 111a and 111b and the second hollow spaces 112a and 112b have structures that can be easily decompressed into a vacuum space.

Modification Examples

Figure 3:
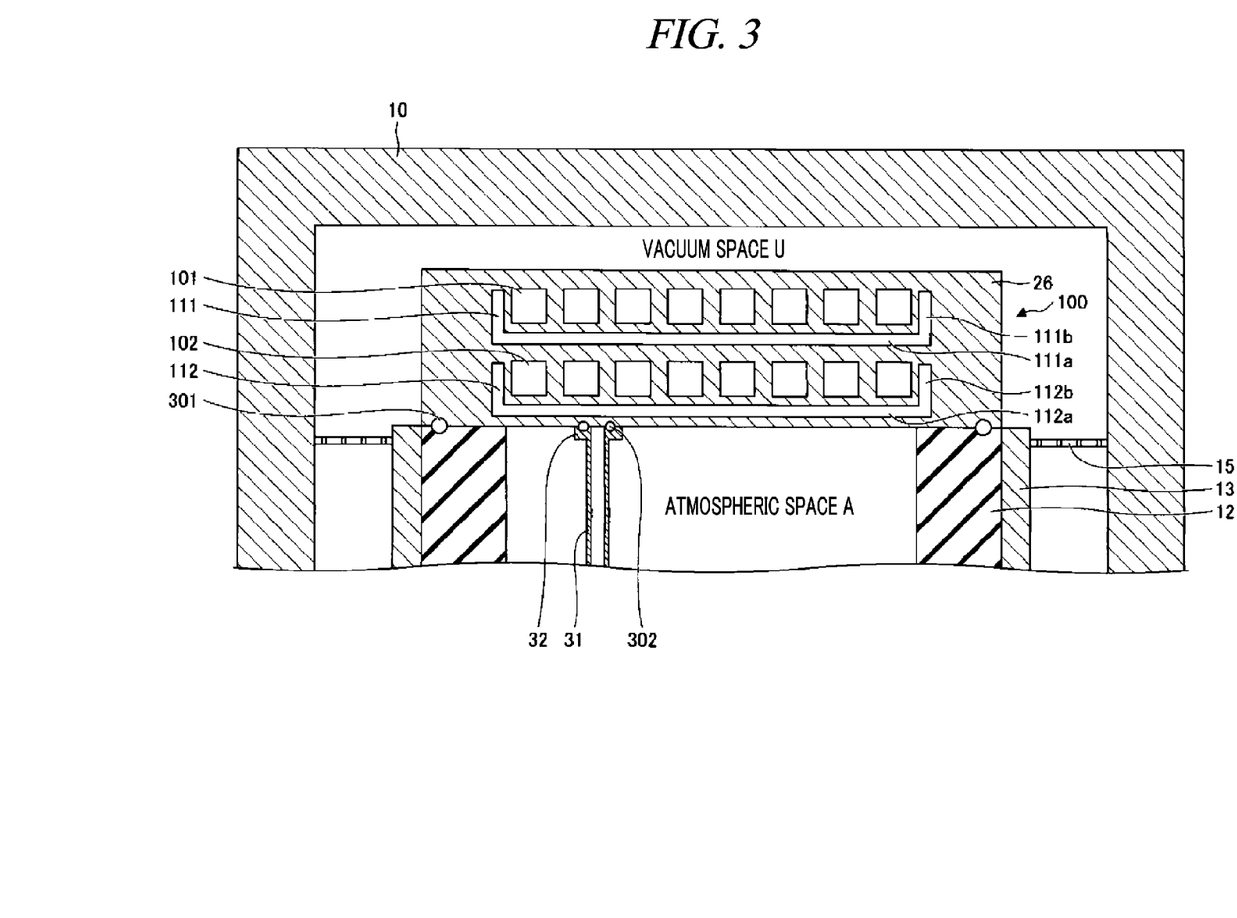
FIG. 3 is a schematic cross sectional view illustrating a placing table according to a modification example of the exemplary embodiment.

In case of forming the first path 101, the first heat insulating layer 111, the second path 102 and the second heat insulating layer 112 to have shapes and sizes capable of achieving the mechanical strength of the base 26, none of these structures may have the fin structure or the lattice structure like the placing table 100 according to the modification example of FIG. 3.

Further, the number of the heat insulating layers may not be limited to two. For example, a single heat insulating layer or multiple heat insulating layers may be provided, or no heat insulating layer may be provided. The number of the path provided under the first path 101 may not be limited to one, and multiple paths or no path may be provided.

In addition, the path(s) such as the second path 102 disposed under the first path 101 may be divided into multiple paths including a low temperature line and a room temperature line, or may be configured as a single line.

If the seal surfaces of the O-rings 301 and 302 can be controlled by the first heat insulating layer 111 to a temperature higher than the glass transition point even when the heat transfer medium having the extremely low temperature is circulated in the first path 101, the second path 102 and the second heat insulating layer 112 may not be provided. In such a case, the O-rings 301 and 302 are disposed under the first heat insulating layer 111 without having the second path 102 and the second heat insulating layer 112 therebetween.

Manufacturing Method

Now, a manufacturing method of the placing table 100 according to the exemplary embodiment and the modification examples will be explained. The base 26 has the first path 101, the first heat insulating layer 111, the second path 102 and the second heat insulating layer 112 formed therein, and the base 26 has a hollow structure.

In the base 26 of the placing table 100 according to the exemplary embodiment, the fin structure 101a is formed within the first path 101. It is desirable to manufacture the base 26 having this configuration by using a 3D printer technology or an additive manufacturing technology. To elaborate, a lamination fabrication technology using a metal material may be used. For example, a fabrication technique of fabricating an object by sintering powder metal by irradiating a laser or an electronic beam thereto, a fabrication technique of fabricating an object by dissolving and depositing, while supplying powder metal or a wire, powder metal or wire with a laser or an electronic beam, or the like may be employed. However, these fabrication techniques are nothing more than examples and are not limiting. Further, the placing table 100 including the base 26 may be manufactured by the 3D printer technology or the additive manufacturing technology.

The placing table and the substrate processing apparatus according to the exemplary embodiment and the modification examples are not intended to be limiting. Further, the exemplary embodiments may be changed and modified in various ways without departing from the scope of the present disclosure as claimed in the following claims. Unless contradictory, the disclosures in the various exemplary embodiments can be combined appropriately.

The placing table of the present disclosure may be applicable to any of various kinds of substrate processing apparatuses such as a capacitively coupled plasma (CCP) apparatus, an inductively coupled plasma (ICP) apparatus, a radial line slot antenna apparatus, an electron cyclotron resonance plasma (ECR) apparatus, a helicon wave plasma (HWP) apparatus, an atomic layer deposition (ALD) apparatus, and so forth. Further, though the above exemplary embodiment has been described for the case where the plasma processing apparatus is used as an example of the substrate processing apparatus, the substrate processing apparatus is not limited to the plasma processing apparatus as long as it performs a preset processing (for example, a film forming processing, an etching processing, or the like) on the substrate. By way of example, the substrate processing apparatus may be a chemical vapor deposition (CVD) apparatus.

According to the exemplary embodiment, it is possible to suppress deterioration of sealing effect of the seal member.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:
1. A placing table, comprising:
   a insulating support;
   a base integrally formed and disposed on the insulating support;
   a first path disposed within the base and configured to allow a heat transfer medium having a first temperature to flow therein;

a second path disposed within the base and configured to allow a heat transfer medium having a second temperature to flow therein and not communicating with the first path, wherein the base comprises therein a first hollow space surrounding a side portion of the first path and formed between the first path and the second path, and a second hollow space surrounding a side portion of the second path and formed at a lower portion of the second path.

2. The placing table of claim 1, further comprising:

a gas supply line connected to a bottom surface of the base;

a first O-ring disposed between the bottom surface of the base and a top surface of the insulating support; and a second O-ring disposed between the bottom surface of the base and a joint portion of the gas supply line.

3. The placing table of claim 2, wherein the first path has a fin structure or a lattice structure.

4. The placing table of claim 3, wherein the second path has a fin structure or a lattice structure.

5. The placing table of claim 4, the first hollow space is controlled to have a pressure lower than an atmospheric pressure.

6. The placing table of claim 5, the second hollow space is controlled to have a pressure lower than an atmospheric pressure.

7. The placing table of claim 1, wherein the second temperature is higher than the first temperature.

8. The placing table of claim 6, wherein the base is formed by a 3D printer technology or an additive manufacturing technology.

9. A substrate processing apparatus comprising:

a processing vessel;

a insulating support within the processing vessel;

a base integrally formed and disposed on the insulating support;

a first path disposed within the base and configured to allow a heat transfer medium having a first temperature to flow therein;

a second path disposed within the base and configured to allow a heat transfer medium having a second temperature to flow therein and not communicating with the first path;

a gas supply line connected to a bottom surface of the base;

a first O-ring disposed between the bottom surface of the base and a top surface of the insulating support; and a second O-ring disposed between the bottom surface of the base and a joint portion of the gas supply line, wherein the base comprises therein a first hollow space surrounding a side portion of the first path and formed between the first path and the second path, and a second hollow space surrounding a side portion of the second path and formed at a lower portion of the second path.

10. The placing table of claim 1, wherein the first temperature is equal to or lower than −100° C., and wherein the second temperature is equal to or larger than 0° C.

11. The substrate processing apparatus of claim 9, wherein the first temperature is equal to or lower than −100° C., and wherein the second temperature is equal to or larger than 0° C.

* * * * *